United States Patent [19]

Grise et al.

[11] 4,375,085

[45] Feb. 22, 1983

[54] DENSE ELECTRICALLY ALTERABLE READ ONLY MEMORY

[75] Inventors: Gary D. Grise, Milton, Vt.; Ning Hsieh, San Jose, Calif.; Howard L. Kalter, Colchester; Chung H. Lam, Williston, both of Vt.

[73] Assignee: International Business Machines Corporation, Armonk, N.Y.

[21] Appl. No.: 221,958

[22] Filed: Jan. 2, 1981

[51] Int. Cl.³ .......................................... G11C 11/40
[52] U.S. Cl. .................................. 365/104; 365/49; 357/54
[58] Field of Search ............... 365/149, 174, 189, 182, 365/183, 103–104; 357/54

[56] References Cited

U.S. PATENT DOCUMENTS

| 124,003 | 2/1872 | DiMaria | 4/440 |
| 153,359 | 7/1874 | Kotecha | 74/96 |
| 160,530 | 3/1875 | Kotecha et al. | 141/378 |
| 200,851 | 3/1878 | Kotecha et al. | 84/352 |
| 3,914,855 | 10/1974 | Cheney et al. | 29/571 |
| 4,055,837 | 10/1977 | Stein et al. | 340/173 |
| 4,104,675 | 8/1978 | DiMaria et al. | 357/54 |
| 4,161,039 | 7/1979 | Rössler | 365/185 |

OTHER PUBLICATIONS

D. J. DiMaria et al., "High Current Injection Into SiO₂ from . . . ", J. Appl. Phys., vol. 51, No. 5, May 1980, pp. 2722–2735.
D. J. DiMaria et al., "Electrically-Alterable Memory Using A . . . ", IEEE Electron Device Letters, vol. EDL-1, No. 9, 9/80, pp. 179–181.
T. P. Cauge et al., "Double-Diffused MOS Transistor Achieves . . . ", Electronics, Feb. 15, 1971, pp. 99–104.

Primary Examiner—Terrell W. Fears
Attorney, Agent, or Firm—Stephen J. Limanek

[57] ABSTRACT

This invention provides an improved electrically alterable read only memory system which includes a semiconductor substrate having a diffusion region therein defining one end of a channel region, a control plate, a floating plate separated from the channel region by a thin dielectric layer and disposed between the control plate and the channel region and means for transferring charge to and from the floating plate. A control gate is coupled to the channel region and is located between the diffusion region and the floating plate. The control gate may be connected to a word line and the diffusion region may be connected to a hit/sense line. The channel region is controlled by the word line and the presence or absence of charge on the floating plate. Thus, information may be read from a cell of the memory by detecting the presence or absence of charge stored in the inversion capacitor under the floating plate. The charge transfer means includes an enhanced conduction insulator and means for applying appropriate voltages to the control plate and to the control gate to transfer charge to and from the floating plate through the enhanced conduction insulator.

14 Claims, 3 Drawing Figures

DENSE ELECTRICALLY ALTERABLE READ ONLY MEMORY

DESCRIPTION

1. Technical Field

This invention relates to integrated semiconductor circuits and more particularly to a storage system or transistor array which may be used in, e.g., an electrically alterable read only memory (EAROM), a non-volatile random access memory, or an electrically alterable programmable logic array.

2. Background Art

Integrated semiconductor circuits, particularly systems or arrays having transistors each of which represents a binary digit of information, as in read only memories (ROM), have achieved high device or cell densities.

In, e.g., U.S. Pat. No. 3,914,855, filed May 9, 1974 there is described a read only memory wherein the array has transistors made with a thin gate dielectric exhibiting a low threshold voltage for storing a "1" digit of binary information and transistors made of a thick gate dielectric exhibiting a considerably higher threshold voltage for storing the other digit of binary information. Also described is a read only memory wherein ion impurities are implanted to render selected devices inoperative, as defining a "1" digit of binary information, while the remaining devices are operative devices or transistors defining the other digit of binary information.

In U.S. Pat. No. 4,161,039, filed Feb. 6, 1978, there is disclosed a memory array utilizing field effect transistors (FET) where information is stored in floating gates and the channel region is made to a short length by employing double-diffusion processing techniques, as disclosed in more detail in "Electronics," Feb. 15, 1971, at pages 99–104. This memory is not a simple read only memory but one that can be reprogrammed after erasing the stored information with ultraviolet light.

U.S. Pat. No. 4,055,837, filed Oct. 22, 1975 by K. U. Stein et al., discloses a single transistor memory wherein information may be stored for long periods of time in a dual insulating structure which is made of silicon nitride formed on silicon dioxide.

Commonly assigned U.S. Pat. No. 4,104,675, filed June 21, 1977 by D. J. DiMaria et al. discloses a non-destructive long-term storage system using a single graded energy band gap structure in which each cell may be driven by a relatively low voltage.

In commonly assigned U.S. patent application Ser. No. 124,003 filed Feb. 25, 1980 by D. J. DiMaria there is disclosed a non-destructive long-term storage system using a dual charge injector or dual graded energy band gap structure in each cell which is driven by a low voltage.

In commonly assigned U.S. patent application Ser. No. 153,359 filed May 27, 1980 by H. N. Kotecha, now U.S. Pat. No. 4,334,292, there is disclosed an improved system for charging and discharging, or writing and erasing, a conductive plate with a charge injector controlled by a low single polarity voltage. In a preferred embodiment of the invention, the conductive plate is a floating gate of a field effect transistor which also includes first and second or dual control gates. A single or double graded band gap layer, such as a silicon-rich layer of silicon dioxide, is disposed only between the floating gate and the first control gate forming a capacitor having a given capacitance with a larger capacitor disposed between the second control gate and the floating gate. These cells or transistors may be used in an array for storing for long periods of time, on the order of 10 years or more, binary digits of information representing a "0" or a "1" depending upon whether a charge is stored on the floating gate. When using these cells in a memory array, information may be written into or erased from each of the cells individually or a blanket erase may be employed for the entire or a selected section of the array.

In commonly assigned U.S. patent application Ser. No. 160,530 filed June 18, 1980 by H. N. Kotecha and F. W. Wiedman, now U.S. Pat. No. 4,336,603 there is disclosed a memory system having cells each of which also has a charge injector but which includes only three terminals for writing, reading and erasing the cell.

Commonly assigned U.S. patent application Ser. No. 200,851, filed Oct. 27, 1980 by H. N. Kotecha, W. P. Noble, Jr. and F. W. Wiedman, describes an electrically alterable read only memory which includes first and second spaced apart diffusions defining a channel region in a semiconductor substrate. A floating gate is disposed over the first diffusion and extends over an end of the channel region. An enhanced conduction insulator or dual charge injector structure is disposed between the floating gate and a control gate, with a portion of the control gate being capacitively coupled to the channel region between the floating gate and the second diffusion.

A detailed discussion of enhanced conduction insulators may be found in an article entitled "High Current Injection Into $SiO_2$ from Si rich $SiO_2$ Films and Experimental Applications" by D. J. DiMaria and D. W. Dong, Journal of Applied Physics 51(5), May 1980, pp. 2722–2735 and a basic memory cell which utilizes the dual electron injector structure is taught in an article entitled "Electrically-Alterable Memory Using a Dual Electron Injector Structure" by D. J. DiMaria, K. M. DeMeyer and D. W. Dong, IEEE Electron Device Letters, Vol. EDL-1, No. 9, September 1980, pp. 179–181.

DISCLOSURE OF THE INVENTION

It is an object of this invention to provide an improved electrically alterable one device memory capable of storing information for a long period of time without the need for refresh circuitry and which may be read out at a speed comparable to that of a conventional one device dynamic random access memory.

It is another object of this invention to provide an improved electrically alterable read only memory or non-volatile random access memory which does not require charge traps and can be operated with relatively low voltages of only one polarity for a large number of cycles.

It is still another object of this invention to provide an improved electrically alterable read only memory having small storage cells wherein each cell requires only one diffusion.

It is a further object of this invention to provide an improved electrically alterable read only memory which uses less power than known electrically alterable read only memories and which is relatively insensitive to alpha particles.

Yet another object of the invention is to provide an improved electrically alterable read only memory having a floating gate and a single diffusion in each cell which may be written and erased by a low voltage charge injector employing a single polarity pulse.

In accordance with the teachings of this invention an improved memory system is provided which includes a semiconductor substrate having a diffusion region therein defining one end of a channel region, a control plate, a floating plate separated from the channel region by a thin dielectric layer and disposed between the control plate and the channel region and means for transferring charge to and from the floating gate. A control gate is coupled to the channel region and is located between the diffusion region and the floating plate. The control gate may be connected to a word line and the diffusion region may be connected to a bit/sense line. The channel region is controlled by the word line and the presence or absence of charge on the floating plate. Thus, information may be read from a cell of the memory by detecting the presence or absence of charge stored in the channel region under the floating plate.

The foregoing and other objects, features and advantages of the invention will be apparent from the following and more particular description of the preferred embodiments of the invention, as illustrated in the accompanying drawing.

BEST MODE FOR CARRYING OUT THE INVENTION

Figure 1:
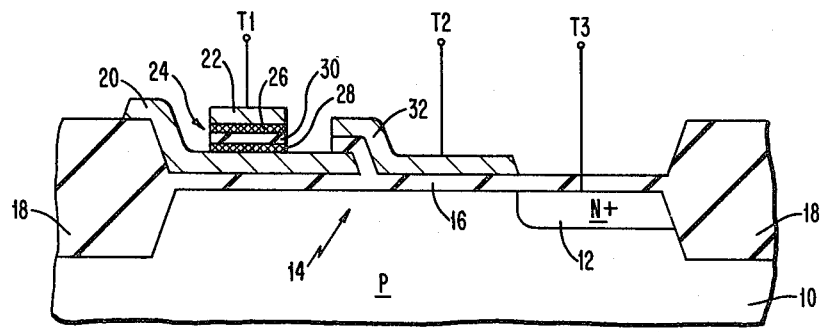
FIG. 1 is a sectional view of a cell or circuit of the present invention.

Referring to FIG. 1 of the drawing in more detail, there is shown a sectional view of a cell of the present invention which includes a silicon substrate 10, preferably of P type conductivity, having disposed therein a diffusion region 12 of N+ type conductivity defining one end of a channel region 14 located near the surface of the substrate 10. A thin dielectric layer 16, preferably made of silicon dioxide, is surrounded by a thick layer of insulating material 18 which is also preferably made of silicon dioxide. A floating plate 20 is formed over the thin dielectric layer 16 with a portion thereof extending over the thick insulating layer 18. A control plate 22, connected to a terminal T1 and an enhanced conduction insulator, preferably a dual electron injector structure 24, are formed over the floating plate 20 with the dual electron injector structure 24 being disposed between the control plate 22 and the floating plate 20. The dual electron injector structure includes first and second layers of silicon-rich silicon dioxide 26 and 28, respectively, with a layer of conventional silicon dioxide 30 being interposed between the first and second silicon-rich silicon dioxide layers 26 and 28. Also formed over the thin dielectric layer 16 between the floating plate 20 and the N+ diffusion region 12 is a control gate 32 connected to a terminal T2. A portion of the control gate 32 extends over and is insulated from the floating plate 20. A terminal T3 is connected to the N+ diffusion region 12.

The capacitance of the capacitor formed by the floating plate 20, the thin dielectric layer 16 and the substrate 10 is preferably substantially larger than that of the capacitor formed by the floating plate 20, the dual electron injector structure 24 and the control plate 22.

The floating plate 20, the control plate 22 and the control gate 32 are preferably made from two or more layers of doped polysilicon as is well known in the semiconductor processing art.

Figure 2:
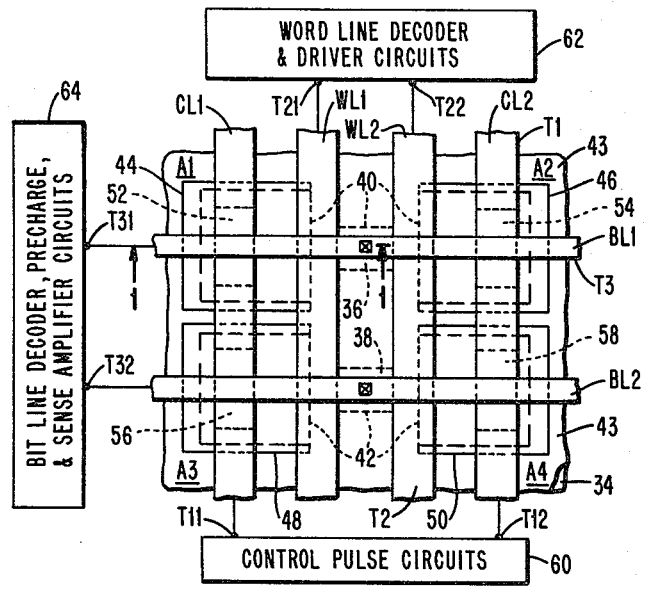
FIG. 2 illustrates a memory system, primarily in plan view, of the present invention having an array of cells each of which may be of the type illustrated in FIG. 1 of the drawing.

As illustrated in FIG. 2 of the drawing, a memory system may be formed having an array of cells each of which is similar to that shown in FIG. 1 of the drawing. FIG. 2 is a plan view of four cells of the type illustrated in sectional view in FIG. 1 of the drawing. The sectional view of the cell illustrated in FIG. 1 is substantially an enlargement of the section taken through line 1—1 in FIG. 2.

The system of FIG. 2 includes a P type silicon substrate 34, having first and second diffusion regions 36 and 38, supporting cells A1, A2, A3 and A4. A first thin dielectric layer 40, disposed on the substrate 34, is provided for cells A1 and A2 and a second thin dielectric layer 42, also disposed on the substrate 34, is provided for cells A3 and A4. Surface areas of the substrate 34 not covered by the thin dielectric layers 40 and 42 are covered by a thick insulating layer 43. Floating plates 44, 46, 48 and 50, formed on the thin dielectric layers 40 and 42, are provided for cells A1, A2, A3 and A4, respectively. A first word line WL1 is formed over the thin dielectric layers 40 and 42 and is disposed between the floating plate 44 and the diffusion region 36 of cell A1 and between the floating plate 48 and the diffusion region 38 of cell A3. A second word line WL2 is also formed over the thin dielectric layers 40 and 42 and is disposed between the floating plate 46 and the diffusion region 36 of cell A2 and between the floating plate 50 and the diffusion region 38 of cell A4. It can be seen that the diffusion region 36 is shared by cells A1 and A2 and that the diffusion region 38 is shared by cells A3 and A4. First, second, third and fourth dual electron injector structures 52, 54, 56 and 58 are formed on the floating plates 44, 46, 48 and 50, respectively. Each of the dual electron injector structures is preferably of the type illustrated in FIG. 1 of the drawing at reference numeral 24. A first control line CL1 is formed over the first and third dual electron injector structures 52 and 56 of the cells A1 and A3, respectively, and a second control line CL2 is formed over the second and fourth dual electron injector structures 54 and 58 of the cells A2 and A4, respectively. A first bit/sense line BL1, preferably made of copper-doped aluminum, is connected to the first diffusion region 36 and a second bit/sense line BL2, also preferably made of copper-doped aluminum, is connected to the second diffusion region 38.

The 2×2 array of the system of FIG. 2 of the drawing has, as can be seen, the first and second control lines CL1 and CL2 connected to terminals T11 and T12, respectively, of control pulse circuit 60, with cells A1 and A3 being coupled to the first control line CL1 and with cells A2 and A4 being coupled to the second control line CL2. The first and second word lines WL1 and WL2 are connected to terminals T21 and T22, respectively, of word line decoder and driver circuits 62, with cells A1 and A3 being coupled to the first word line WL1 and with cells A2 and A4 being coupled to the second word line WL2. The first and second bit/sense lines BL1 and BL2 are connected to terminals T31 and T32, respectively, of bit line decoder, precharge and sense amplifier circuits 64, with cells A1 and A2 being coupled to the first bit/sense line BL1 and cells A3 and A4 being coupled to the second bit/sense line BL2. The control pulse circuit 60, the word line decoder and driver circuits 62 and the bit line decoder, precharge and sense amplifier circuits 64 may employ conventional circuitry.

Figure 3:
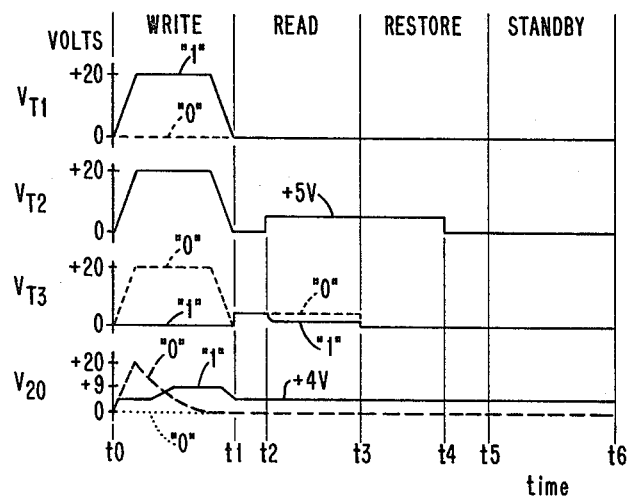
FIG. 3 is a pulse program which may be used to operate the cell of FIG. 1 or a cell of the system illustrated in FIG. 2 of the drawing.

In order to better understand the operation of the cells illustrated in FIGS. 1 and 2 of the drawing, reference may be had to the pulse program indicated in FIG. 3 of the drawing. To write information into the cell of FIG. 1, or, e.g., into the cell A1 of FIG. 2 wherein terminals T11, T21 and T31 correspond to terminals T1, T2 and T3, respectively, of the cell of FIG. 1, voltages $V_{T1}$, $V_{T2}$ and $V_{T3}$ are applied to terminals T1, T2 and T3, respectively, as indicated in FIG. 3 in the write section between times t0 and t1. To write a "1" binary digit the voltage $V_{T1}$ of approximately 20 volts, as shown in solid lines, is applied to terminal T1 and the voltage $V_{T3}$ of approximately zero volts is applied to terminal T3. By also applying a voltage of, say, 20 volts, to terminal T2, an inversion layer is formed along the entire channel region 14 between the N+ diffusion region 12 and the thick insulating layer 18. With this arrangement, the channel region 14 under the floating plate 20 is at approximately zero volts. Since 20 volts has been applied to terminal T1 and since the capacitance of the capacitor formed by the floating plate 20, the thin dielectric layer 16 and the channel region 14 is substantially larger than the capacitance of the capacitor formed by the floating plate 20, the dual electron injector structure 24 and the control plate 22, most of the voltage drop occurs across the dual electron injector structure 24. In the case of a previously unwritten cell or a cell written to a "0" state, the magnitude of the voltage impressed across the dual injector structure 24 is sufficient to cause electrons to flow from the floating plate 20 to the control plate 22 resulting in an accumulation of positive charge on the floating plate 20. A voltage $V_{20}$ of approximately +4 volts resulting from the 20 volts applied to the control plate 22 occurs and increases to +9 volts approximately due the accumulation of positive charge resulting from the aforementioned electron flow. In the case of a previously written "1" the magnitude of the voltage impressed across the dual injector structure 24 is insufficient to cause further electron flow and a voltage $V_{20}$ of approximately +9 volts resulting from the 20 volts applied to the control plate 22 and the previously stored positive charge results. As the voltage on terminal T1 is reduced to zero volts, the voltage at the floating plate 20 will be established at approximately +5 volts due to the positive charge on floating plate 20. The +5 volts on the floating plate 20 continues to maintain a potential well in the channel region 14 under the floating plate forming an inversion capacitor even after the voltage at terminal T2 is reduced to zero volts, thus charge continues to be stored in the channel region 14 which may later be detected to determine the presence of a "1" being stored in the cell. If a "0" digit is to be stored in the cell, the voltage at terminal T1 is set to approximately zero volts and the voltages at terminals T2 and T3 are set to approximately +20 volts, as indicated in FIG. 3. In this latter arrangement charge transfer will occur depending on the previous state of the floating plate 20. If a "1" has been stored, an inversion layer in the channel region 14 under the floating plate 20 exists, hence the floating plate 20 is capacitively coupled up to at least 20 volts, and this magnitude of voltage impressed across the dual electron injector structure 24 causes electron flow from the control plate 22 to the floating plate 20 neutralizing the stored positive charges on the floating plate 20 as illustrated in $V_{20}$ of FIG. 3 by the dashed line. If a "0" has been stored, the aforementioned inversion layer in the channel region 14 under the floating plate 20 does not exist, therefore, charge does not flow to the channel region 14 under the floating plate 20. Consequently, there is no substantial capacitive coupling to the floating plate 20 and, thus, the floating plate 20 remains at zero volts after the applied voltages $V_{T2}$ and $V_{T3}$ have been returned to zero volts, as indicated by the dotted line of $V_{20}$ between times t0 and t1 in FIG. 3.

To read the information stored in the cell, the terminal T1 remains at zero volts and the voltage at terminal T3 is raised to a precharge voltage of approximately +5 volts, as indicated between times t1 and t2 of FIG. 3, and then the terminal T3 is permitted to float electrically. At time t2, the voltage on terminal T2 is raised to an operating voltage of approximately +5 volts and the voltage at terminal T3 is observed. If a "1" digit has been stored in the cell, the charge in the potential well will flow to the N+ diffusion region 12 causing the +5 volt charge at terminal T3 to discharge somewhat as indicated by voltage $V_{T3}$ during time t2 to t3. If, however, a "0" digit has been stored in the cell, there is no available charge in the channel region 14 to cause a discharge and, therefore, the terminal T3 remains at +5 volts, as indicated by the dashed line between times t2 and t3 in voltage curve $V_{T3}$.

After reading information from the cell, charge must be re-introduced into potential wells representing a "1" digit of binary information, as indicated by the restore portion of the cycle between times t3 and t5 of FIG. 3. With the voltage $V_{T1}$ at zero volts and the voltage $V_{T2}$ at +5 volts, the voltage $V_{T3}$ at terminal T3 is lowered to zero volts producing a source of charges for any potential well formed by a positively charged floating plate 20. At time t4 the voltage at terminal T2 is reduced to zero volts trapping the charge in the potential well.

When the memory is not in use, i.e., during standby, each of the terminals T1, T2 and T3 is at a zero voltage, with the floating gate 20 remaining charged at +5 volts if a "1" digit has been stored or at zero volts if a "0" digit has been stored. It has been found that the charge on a floating plate remains substantially unchanged for 10 or more years, if desired.

Although the voltage $V_{T1}$ during the write portion of the cycle was indicated as having a magnitude of +20 volts, it should be understood that, if an enhanced signal is desired for the "1" digit, a higher voltage, e.g., 25 volts, may be applied to the terminal T1 between times t0 and t1, or alternatively, a somewhat negative pulse may be applied to the terminal T1 when a "0" digit is written into the cell.

To erase information stored in a cell, a "0" digit is written into each cell location in the manner described hereinabove.

It can be seen, of course, that by pulsing a word line, such as word line WL1 in FIG. 2, and applying appropriate pulses to the bit lines, such as bit/sense lines BL1 and BL2, associated with the word line, a column of cells may be written into or read from simultaneously. It should also be understood that all of the cells of the array of FIG. 2 may be erased simultaneously by, e.g., applying a negative pulse of, say, −20 volts, to the terminals T11 and T12 of the control pulse circuit 60, with the voltages $V_{T2}$ and $T_{T3}$ being held at zero volts.

It should also be noted that the cells A2, A3 and A4 of FIG. 2 may be written into, read from and erased in the same manner as described hereinabove in connection with the writing, reading and erasing of the cell illustrated in FIG. 1 or the cell A1 of FIG. 2 by selecting the appropriate word, bit/sense and control lines. For example, to select cell A2, the first bit/sense line BL1, the second word line WL2 and the second control line CL2 are used, to select cell A3, the second bit/sense line BL2, the first word line WL1 and the first control line CL1 are used, and to select cell A4, the second bit/sense line BL2, the second word line WL2 and the second control line CL2 are used.

Although a particular pulse program has been indicated in FIG. 3 by which the cells of this invention may be operated, it should be understood that other pulse programs may be used, if desired. For example, all control plates, such control plate 22 in FIG. 1 or all control lines such as control lines CL1 and CL2 may be interconnected and a selected word written by first writing all "0" digits followed by writing all "1" digits, which eliminates the need for decoding the control plates or lines.

It can also be seen that a wider range of operation may be had by providing both positive and negative charge on the floating plate 20 by appropriately pulsing the terminals T1 and T3, with terminal T2 having a sufficient voltage to invert the channel region 14 under the control gate 32 of FIG. 1, resulting in increased noise immunity and improved signals.

It should be noted that in the interest of clarity, an array having only four cells has been illustrated in FIG. 2 of the drawing, however, in practice hundreds of word lines would be used with each word line having hundreds of cells coupled thereto to provide an array of many thousands of cells.

Also, while an embodiment of this invention has been illustrated as having a P type semiconductor substrate, it should be realized that in another embodiment an N type substrate may be used with all polarities being reversed.

Accordingly, it can be seen that a simple and very compact cell has been provided which may be used in electrically alterable read only memories employing only one device per cell having a single diffusion by selectively charging and discharging a floating plate and detecting the presence or absence of charge under the floating plate. It should also be noted that the cell of this invention which is capable of storing information virtually permanently can be read out at speeds comparable to that of conventional one device dynamic FET random access memory cells and written into with relatively low voltages of only one polarity requiring less power.

While the invention has been particularly shown and described with reference to preferred embodiments thereof, it will be understood by those skilled in the art that various changes in form and details may be made therein without departing from the spirit and scope of the invention.

What is claimed is:

1. A memory comprising;
   a semiconductor substrate of a first conductivity type having a region of a second conductivity type defining one end of a channel region,
   a control plate,
   a floating plate disposed between said control plate and said channel region,
   a control gate disposed between said floating plate and said second conductivity type region and coupled to said channel region,
   means for selectively charging said floating plate to form an inversion capacitor in said channel region,
   means for supplying charge to said inversion capacitor, and
   means for detecting the charge in said inversion capacitor.

2. A memory as set forth in claim 1 further including an enhanced conduction insulator disposed between said control plate and said channel region.

3. A memory as set forth in claim 2 wherein the capacitance of the capacitor formed by said floating plate and said semiconductor substrate is substantially larger than the capacitance of the capacitor formed by said floating plate and said control plate.

4. A memory as set forth in claim 3 wherein said enhanced conduction insulator is disposed between said floating plate and said control plate.

5. A memory as set forth in claim 2 wherein said floating plate charging means includes means for applying voltages to said control plate and to said second conductivity type region.

6. A memory as set forth in claim 5 wherein said detecting means is connected to said second conductivity type region.

7. A memory comprising;
   a semiconductor substrate of a first conductivity type having a region of a second conductivity type defining one end of a channel region,
   a control plate,
   a floating plate disposed between said control plate and said channel region,
   a dual electron injector structure disposed between said control plate and said floating plate,
   a control gate disposed between said floating plate and said second conductivity type region and coupled to said channel region,
   means for selectively charging said floating plate to form an inversion capacitor in said channel region, said means including means for applying voltages to said control plate and to said second conductivity type region,
   means for supplying charge to said inversion capacitor, and
   means for detecting the charge in said inversion capacitor.

8. A memory as set forth in claim 7 wherein the capacitance of the capacitor formed by said floating plate and said semiconductor substrate is substantially larger than the capacitance of the capacitor formed by said floating plate and said control plate.

9. A memory as set forth in claim 8 wherein said dual electron injector structure includes first and second silicon-rich silicon dioxide layers and a silicon dioxide insulating layer interposed between said first and second silicon-rich silicon dioxide layers.

10. An electrically alterable read only memory comprising;
    an array of memory cells, each of said cells including:
       a semiconductor substrate of a first conductivity type having a region of a second conductivity type defining one end of a channel region,
       a control plate, a floating plate disposed between said control plate and said channel region, and a control gate disposed between said floating plate and said second conductivity type region and coupled to said channel region, a first word line connected to a first plurality of said cells at the control gate thereof, a second word line connected to a second plurality of said cells at the control gate thereof, a first bit/sense line connected to one of said first plurality of cells and to one of said second plurality of cells at the second conductivity type region thereof, a second bit/sense line connected to another of said first plurality of cells and to another of said second plurality of cells at the second conductivity type region thereof, means for applying control pulses to the control plates of said cells, means for selectively applying pulses to said first and second word lines, means for selectively applying pulses to said first and second bit/sense lines, and sensing means coupled to said first and second bit/sense lines.

11. An electrically alterable read only memory as set forth in claim 10 wherein each of the cells of said array further includes an enhanced conduction insulator disposed between said control plate and said floating plate.

12. An electrically alterable read only memory as set forth in claim 11 wherein the capacitance of the capacitor formed by said floating plate and said control plate is substantially smaller than the capacitance of the capacitor formed by said floating plate and said semiconductor substrate.

13. An electrically alterable read only memory as set forth in claim 10 wherein each of the cells of said array further includes a dual electron injector structure disposed between said control plate and said floating plate.

14. An electrically alterable read only memory as set forth in claim 13 wherein each of said dual electron injector structures includes first and second silicon-rich silicon dioxide layers and a silicon dioxide insulating layer interposed between said first and second silicon-rich insulating layers.

* * * * *